United States Patent
Huang et al.

(10) Patent No.: US 9,064,823 B2
(45) Date of Patent: Jun. 23, 2015

(54) METHOD FOR QUALIFYING A SEMICONDUCTOR WAFER FOR SUBSEQUENT PROCESSING

(71) Applicant: Taiwan Semiconductor Manufacturing Co., Ltd., Hsin-Chu (TW)

(72) Inventors: I-Che Huang, Hsinchu (TW); Pu-Fang Chen, Hsinchu (TW); Ting-Chun Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 13/889,515

(22) Filed: May 8, 2013

(65) Prior Publication Data

US 2014/0273291 A1    Sep. 18, 2014

Related U.S. Application Data

(60) Provisional application No. 61/778,774, filed on Mar. 13, 2013.

(51) Int. Cl.

| | |
|---|---|
| *G06F 17/50* | (2006.01) |
| *H01L 21/322* | (2006.01) |
| *C30B 15/00* | (2006.01) |
| *C03B 15/14* | (2006.01) |
| *C30B 23/00* | (2006.01) |
| *H01L 21/66* | (2006.01) |
| *C30B 29/06* | (2006.01) |

(52) U.S. Cl.
CPC ............ *H01L 21/3225* (2013.01); *C30B 29/06* (2013.01); *H01L 2924/0002* (2013.01); *H01L 22/12* (2013.01)

(58) Field of Classification Search
CPC ...... C03B 29/06; H01L 21/3325; H01L 22/10
USPC .................. 716/54, 56, 136; 117/1, 3, 13, 89
See application file for complete search history.

(56) References Cited

U.S. PATENT DOCUMENTS

| | | | | |
|---|---|---|---|---|
| 4,342,616 A | * | 8/1982 | Elliott et al. | 324/71.5 |
| 6,040,211 A | * | 3/2000 | Schrems | 438/238 |
| 6,048,395 A | * | 4/2000 | Iida et al. | 117/20 |

(Continued)

FOREIGN PATENT DOCUMENTS

| | | |
|---|---|---|
| KR | 1020080017205 | 2/2008 |
| KR | 20120004925 A | 1/2012 |

*Primary Examiner* — Helen Rossoshek
(74) *Attorney, Agent, or Firm* — Eschweiler & Associates, LLC

(57) ABSTRACT

A method is provided for qualifying a semiconductor wafer for subsequent processing, such as thermal processing. A plurality of locations are defined about a periphery of the semiconductor wafer, and one or more properties, such as oxygen concentration and a density of bulk micro defects present, are measured at each of the plurality of locations. A statistical profile associated with the periphery of the semiconductor wafer is determined based on the one or more properties measured at the plurality of locations. The semiconductor wafer is subsequently thermally treated when the statistical profile falls within a predetermined range. The semiconductor wafer is rejected from subsequent processing when the statistical profile deviates from the predetermined range. As such, wafers prone to distortion, warpage, and breakage are rejected from subsequent thermal processing.

19 Claims, 3 Drawing Sheets

(56) References Cited

U.S. PATENT DOCUMENTS

| | | | |
|---|---|---|---|
| 6,120,599 A * | 9/2000 | Iida et al. | 117/20 |
| 6,348,180 B1 * | 2/2002 | Iida et al. | 423/348 |
| 6,569,535 B2 * | 5/2003 | Murakami et al. | 428/446 |
| 6,709,721 B2 * | 3/2004 | Rocha-Alvarez et al. | 427/569 |
| 6,893,499 B2 * | 5/2005 | Fusegawa et al. | 117/13 |
| 6,905,800 B1 * | 6/2005 | Yuen et al. | 430/5 |
| 7,192,790 B2 * | 3/2007 | Ishii et al. | 438/11 |
| 7,203,559 B2 * | 4/2007 | Ito et al. | 700/97 |
| 7,205,161 B2 * | 4/2007 | Klaerner et al. | 436/531 |
| 7,217,320 B2 * | 5/2007 | Kim et al. | 117/13 |
| 7,320,731 B2 * | 1/2008 | Ono et al. | 117/20 |
| 7,394,129 B2 * | 7/2008 | Graf et al. | 257/347 |
| 7,397,110 B2 * | 7/2008 | Takase et al. | 257/611 |
| 7,404,856 B2 * | 7/2008 | Haga et al. | 117/20 |
| 7,442,253 B2 * | 10/2008 | Falster et al. | 117/89 |
| 7,503,975 B2 * | 3/2009 | Yamazaki et al. | 117/4 |
| 7,700,394 B2 * | 4/2010 | Sadamitsu et al. | 438/45 |
| 7,718,926 B2 * | 5/2010 | Matsuzawa et al. | 219/411 |
| 7,828,893 B2 * | 11/2010 | Mueller et al. | 117/3 |
| 7,928,317 B2 * | 4/2011 | Atanackovic | 136/252 |
| 7,964,275 B2 * | 6/2011 | Muller et al. | 428/332 |
| 7,998,845 B2 * | 8/2011 | Kasahara et al. | 438/487 |
| 8,197,594 B2 * | 6/2012 | Nakai et al. | 117/2 |
| 8,334,170 B2 * | 12/2012 | Wang et al. | 438/109 |
| 8,343,618 B2 * | 1/2013 | Fukuda et al. | 428/212 |
| 8,387,674 B2 * | 3/2013 | Yu et al. | 156/535 |
| 8,411,263 B2 * | 4/2013 | Uchino et al. | 356/237.2 |
| 8,586,452 B2 * | 11/2013 | Lochtefeld et al. | 438/478 |
| 8,673,248 B2 * | 3/2014 | Kulkarni | 423/220 |
| 2006/0046431 A1 * | 3/2006 | Blietz et al. | 438/455 |
| 2007/0035322 A1 | 2/2007 | Kang et al. | |
| 2008/0113171 A1 * | 5/2008 | Nakai et al. | 428/218 |
| 2009/0038669 A1 * | 2/2009 | Atanackovic | 136/244 |
| 2009/0242843 A1 * | 10/2009 | Ebara | 252/500 |
| 2012/0007978 A1 | 1/2012 | Passek et al. | |
| 2012/0168911 A1 * | 7/2012 | Chen et al. | 257/615 |
| 2012/0235283 A1 * | 9/2012 | Libbert et al. | 257/618 |
| 2012/0301976 A1 * | 11/2012 | Kuwabara | 438/7 |
| 2013/0078588 A1 * | 3/2013 | Senda et al. | 432/9 |
| 2013/0186178 A1 * | 7/2013 | Usagawa | 73/31.06 |
| 2013/0187249 A1 * | 7/2013 | Cooney et al. | 257/432 |
| 2013/0229638 A1 * | 9/2013 | Chen et al. | 355/53 |
| 2014/0042715 A1 * | 2/2014 | Hsu et al. | 279/3 |
| 2014/0044945 A1 * | 2/2014 | Mueller et al. | 428/216 |

\* cited by examiner

METHOD FOR QUALIFYING A SEMICONDUCTOR WAFER FOR SUBSEQUENT PROCESSING

CROSS REFERENCE TO RELATED APPLICATION

This application is a Non-Provisional patent application claiming priority to U.S. Provisional Patent Application Ser. No. 61/778,774 filed Mar. 13, 2013, entitled "Improved Wafer Strength by Control of Uniformity of Edge Bulk Micro Defects" in the name of I-Che Huang, et al., and is hereby incorporated by reference.

BACKGROUND

In semiconductor manufacturing, semiconductor wafers often undergo many processing steps or stages before a completed die is formed. For example, thermal processing is often performed on wafers for various purposes, such as Shallow Trench Isolation (STI), repairing film defects, dopant activation from ion implantations, and film property transformation, among others.

Bulk Micro Defects (BMDs) may be further induced by thermal processing, as proven useful in semiconductor processing for metal contamination gathering effects. Although BMDs may provide the advantageous metal gathering effect, the thermal processing associated with the formation of the BMDs also has a tendency to reduce wafer strength, which can lead to undesirable wafer distortion (warping), substrate lattice dislocation, and/or broken wafers which lead to failures of the wafer and lower yields of final products.

Conventional methods for maintaining wafer strength have been primarily limited to controlling an overall oxygen concentration and crystalline defect densities across an entire semiconductor ingot during the ingot preparation process.

BRIEF SUMMARY

The following presents an overview of the disclosure in order to provide a basic understanding of one or more aspects of the disclosure. This is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

In one embodiment, the present disclosure relates to a method for qualifying a semiconductor wafer for subsequent processing, such as thermal processing. The method comprises defining a plurality of locations about a periphery of the semiconductor wafer and measuring one or more properties of the semiconductor wafer at each of the plurality of locations. The one or more properties, for example, comprise an oxygen concentration and a density of bulk micro defects present at each of the plurality of locations about the periphery of the semiconductor wafer. In several examples, a statistical profile associated with the periphery of the semiconductor wafer is determined, based on the one or more properties measured at the plurality of locations. Subsequently, the semiconductor wafer is permitted to undergo thermal treatment when the statistical profile falls within a predetermined range, and the semiconductor wafer is rejected or prevented from such subsequent thermal processing when the statistical profile deviates from the predetermined range.

According to one or more examples, the statistical profile associated with the periphery of the semiconductor wafer is determined by dividing a difference between a maximum and a minimum of the respective one or more properties measured at the plurality of locations by a statistical mean of the respective one or more properties at the plurality of locations. In one example the predetermined range in which a semiconductor wafer is permitted to undergo subsequent thermal processing comprises a statistical profile of bulk micro defects ranging between zero and one.

DETAILED DESCRIPTION

Figure 1:
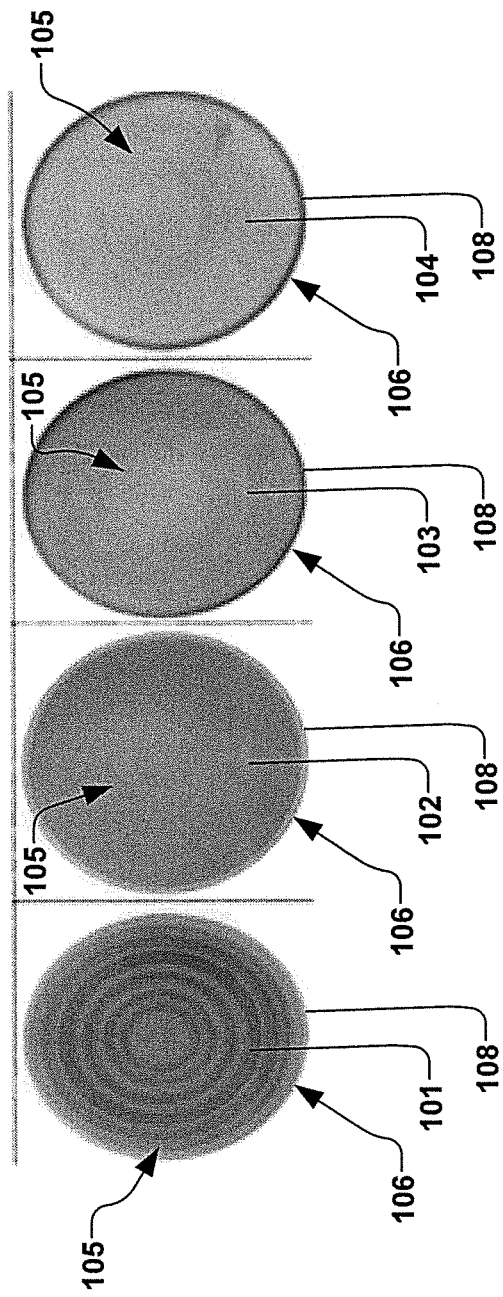
FIG. 1 illustrates four semiconductor wafers having differing edge bulk micro defects in accordance with one aspect.

The present disclosure provides a method for qualifying a semiconductor wafer for subsequent processing, such as thermal processing. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In semiconductor manufacturing, bulk micro defects (BMDs) have been evidenced in semiconductor wafers and/or semiconductor ingots, and have been advantageously utilized to provide metal contamination gathering effects. Although BMDs may provide the advantageous metal gathering effect, the thermal processing associated with the formation of the BMDs also has a tendency to reduce wafer strength, which can lead to undesirable wafer distortion (warping), substrate lattice dislocation, and/or broken wafers which lead to failures of the wafer and lower yields of final products. In some instances, the semiconductor wafer comprises Czochralski (CZ) and float-zone (FZ) crystals formed therein, which can further reduce wafer strength due to additional crystal defects imposed in the wafer.

Heretofore, examination of BMDs in a semiconductor workpiece have not taken into consideration the distribution of BMDs in an edge or periphery of the semiconductor wafer. The present disclosure finds a new appreciation that the BMD distribution in the wafer edge affects stresses in the wafer during subsequent thermal processing. Accordingly, an analysis of the edge of the semiconductor wafer can advantageously predict subsequent failures and maintain adequate metal ion gathering abilities of the wafer. Thus, the analysis of the present disclosure can be utilized to qualify wafers for subsequent processing, wherein losses due to breakage and/or performance can be minimized.

Referring now to FIG. 1, a first semiconductor wafer 101, second semiconductor wafer 102, third semiconductor wafer 103, and fourth semiconductor wafer 104 are illustrated, wherein each of the first, second, third, and fourth semiconductor wafers originate from different lots and/or wafer manufacturers. The first semiconductor wafer 101, second semiconductor wafer 102, third semiconductor wafer 103, and fourth semiconductor wafer 104 are generally referred to a semiconductor wafer 105. The present disclosure particularly addresses a periphery 106 of the semiconductor wafer 105, wherein the periphery, in one example, comprises a region extending inwardly (e.g. approximately 10 mm) from an outermost edge 108 of the wafer.

Figure 2:
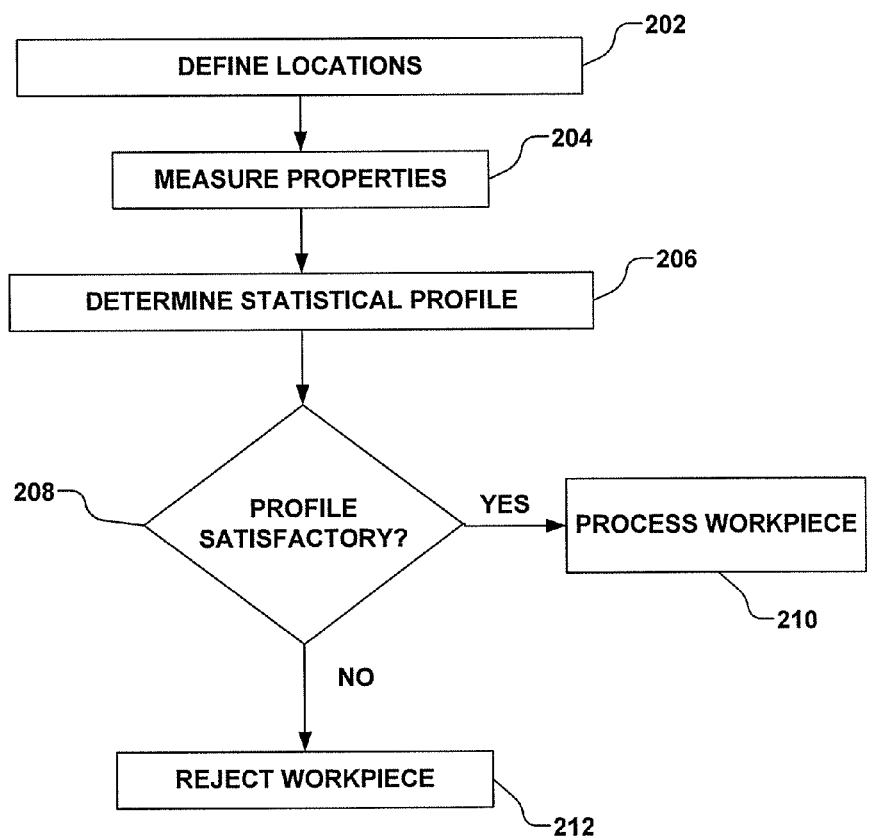
FIG. 2 illustrates a methodology for qualifying a workpiece in accordance with another aspect.

Referring now to FIG. 2, a method 200 for qualifying a semiconductor wafer for subsequent processing is provided. The method 200, for example, comprises defining a plurality of locations about the periphery of the semiconductor wafer in act 202. For example, ten or more locations within approximately 10 mm from the outermost edge 108 of the semiconductor wafer 105 of FIG. 1 are defined in act 202 of FIG. 2.

In act 204, one or more properties of the semiconductor wafer are measured at each of the plurality of locations. The one or more properties, for example, comprise one or more of an oxygen concentration and a density of bulk micro defects present at each of the plurality of locations. Measuring the one or more properties of the semiconductor wafer, for example, comprises analyzing the semiconductor wafer 105 of FIG. 1 with one or more of a microscope and x-ray.

In act 206, a statistical profile associated with the periphery of the semiconductor wafer is determined, wherein the statistical profile is based on the one or more properties measured at the plurality of locations. The statistical profile determined in act 206 for example, comprises dividing a difference between a maximum and a minimum of the respective one or more properties measured at the plurality of locations by a statistical mean of the respective one or more properties at the plurality of locations. For example, a minimum measured density of BMDs is subtracted from a maximum measured density of BMDs from the measurement of act 204, and the difference is divided by a statistical mean of the plurality of measured densities of BMDs, thus yielding the statistical profile associated with the periphery of the semiconductor wafer.

In act 208, a determination is made as to whether the statistical profile garnered in act 206 is acceptable. For example, if the statistical profile falls within a predetermined range, the semiconductor wafer is sent for subsequent processing, such as thermal treatment or other processing in act 210. If the statistical profile deviates or does not fall within the predetermined range, the semiconductor wafer is rejected from subsequent processing in act 212, thereby mitigating potential defects such as warpage, breakage, or other wafer distortion. The predetermined range, for example, comprises a statistical profile for BDMs ranging between zero and one. In other examples, the one or more properties measured in act 204 comprise the oxygen concentration. As such, the predetermined range of the statistical profile, for example, can comprise an oxygen concentration ranging between approximately 9.5 parts per million atoms and approximately 11.5 parts per million atoms.

Figure 3:
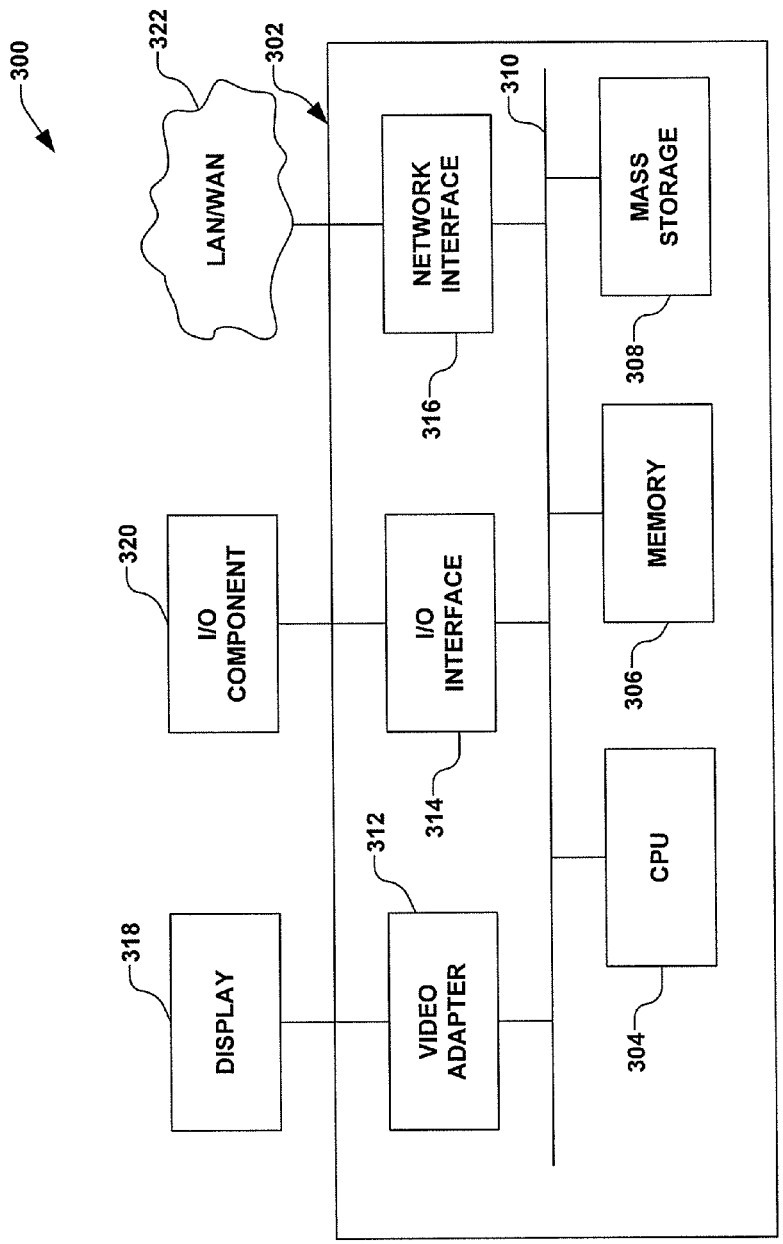
FIG. 3 illustrates a schematic representation of a processor-based system for qualifying a wafer in accordance with various aspects.

In accordance with another aspect, the aforementioned methodology may be implemented using computer program code in one or more general purpose computer or processor based system. As illustrated in FIG. 3, a block diagram is provided of a processor based system 300 in accordance with another embodiment. The processor based system 300 is a general purpose computer platform and may be used to implement processes discussed herein. The processor based system 300 may include a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 308 may include any type of storage device configured to store data, programs, and other information and to make the data, programs, and other information accessible via the bus 310. The mass storage device 308 may include, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described embodiments may be implemented by program code. Accordingly, explicit discussion herein is omitted.

Further, it should be noted that the modules and devices in FIG. 1 may all be implemented on one or more processor based systems 300 of FIG. 3. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for qualifying a semiconductor wafer for subsequent processing, the method comprising:
    defining a plurality of locations in a peripheral region extending a predetermined amount inwardly from an outermost edge of the semiconductor wafer;
    measuring one or more properties of the semiconductor wafer at each of the plurality of locations, wherein the one or more properties are selected from a group consisting of oxygen concentration and a density of bulk micro defects present at each of the plurality of locations;
    determining a statistical profile associated with the periphery of the semiconductor wafer based on the one or more properties measured at the plurality of locations; and
    thermally treating the semiconductor wafer when the statistical profile falls within a predetermined range, and rejecting the semiconductor wafer from subsequent processing when the statistical profile deviates from the predetermined range.

2. The method of claim 1, wherein determining the statistical profile associated with the periphery of the semiconductor wafer comprises dividing a difference between a maximum and a minimum of the respective one or more properties measured at the plurality of locations by a statistical mean of the respective one or more properties at the plurality of locations.

3. The method of claim 2, wherein the predetermined range comprises a statistical profile of bulk micro defects ranging between zero and one.

4. The method of claim 2, wherein the predetermined range comprises a statistical profile of oxygen concentration ranging between approximately 9.5 parts per million atoms and approximately 11.5 parts per million atoms.

5. The method of claim 1, wherein the semiconductor wafer comprises a doped silicon wafer.

6. The method of claim 5, wherein the semiconductor wafer comprises Czochralski (CZ) and float-zone (FZ) crystals formed therein.

7. The method of claim 1, wherein measuring the one or more properties of the semiconductor wafer at each of the plurality of locations comprises analyzing the semiconductor wafer with one or more of a microscope and x-ray.

8. The method of claim 1, wherein the plurality of locations comprise ten or more locations.

9. The method of claim 1, wherein the plurality of locations are within approximately 10 mm from the outermost edge of the semiconductor wafer.

10. A method for processing a semiconductor wafer, the method comprising:
    measuring one or more properties of the semiconductor wafer at a plurality of locations in a peripheral region extending a predetermined amount inwardly from an outermost edge of the semiconductor wafer, wherein the one or more properties comprise one or more of an oxygen concentration and a density of bulk micro defects;
    determining a statistical profile associated with one or more properties of the semiconductor wafer at each of the plurality of locations; and
    thermally treating the semiconductor wafer when the statistical profile falls within a predetermined range, and rejecting the semiconductor wafer from subsequent processing when the statistical profile deviates from the predetermined range.

11. The method of claim 10, wherein the determining the statistical profile comprises dividing a difference between a maximum and a minimum of the respective one or more properties measured at the plurality of locations by a statistical mean of the respective one or more properties at the plurality of locations.

12. The method of claim 11, wherein the predetermined range comprises a statistical profile of bulk micro defects ranging between zero and one.

13. The method of claim 11, wherein the predetermined range comprises a statistical profile of oxygen concentration ranging between approximately 9.5 parts per million atoms and approximately 11.5 parts per million atoms.

14. The method of claim 10, wherein the semiconductor wafer comprises a doped silicon wafer.

15. The method of claim 14, wherein the semiconductor wafer comprises Czochralski (CZ) and float-zone (FZ) crystals formed therein.

16. The method of claim 10, wherein measuring the one or more properties of the semiconductor comprises analyzing the semiconductor wafer with one or more of a microscope and x-ray.

17. The method of claim 10, wherein the plurality of locations comprise ten or more locations.

18. The method of claim 10, wherein the plurality of locations are within approximately 10 mm from the outermost edge of the semiconductor wafer.

19. A computer program product for providing semiconductor processing control, the computer program product having a non-transitory medium with a computer program embodied thereon, the computer program comprising a computer program code for:

defining a plurality of locations in a peripheral region extending a predetermined amount inwardly from an outermost edge of a semiconductor wafer;

directing a measurement of one or more properties of the semiconductor wafer at each of the plurality of locations, wherein the one or more properties are selected from a group consisting of oxygen concentration and a density of bulk micro defects present at each of the plurality of locations;

determining a statistical profile associated with the periphery of the semiconductor wafer based on the one or more properties measured at the plurality of locations; and qualifying the semiconductor wafer for subsequent processing when the statistical profile falls within a predetermined range, and rejecting the semiconductor wafer from subsequent processing when the statistical profile deviates from the predetermined range.

* * * * *